(12) United States Patent
Hu et al.

(10) Patent No.: US 11,227,878 B2
(45) Date of Patent: Jan. 18, 2022

(54) DISPLAY PANEL, MANUFACTURING METHOD FOR THE DISPLAY PANEL, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Junyan Hu, Hubei (CN); Sihang Bai, Hubei (CN); Guochao Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 341 days.

(21) Appl. No.: 16/472,030

(22) PCT Filed: Mar. 20, 2019

(86) PCT No.: PCT/CN2019/078873
§ 371 (c)(1),
(2) Date: Jun. 20, 2019

(87) PCT Pub. No.: WO2020/118956
PCT Pub. Date: Jun. 18, 2020

(65) Prior Publication Data
US 2021/0335842 A1    Oct. 28, 2021

(30) Foreign Application Priority Data

Dec. 12, 2018   (CN) .......................... 201811521178.5

(51) Int. Cl.
*H01L 27/14*    (2006.01)
*H01L 27/12*    (2006.01)

(52) U.S. Cl.
CPC ........ *H01L 27/1248* (2013.01); *H01L 27/124* (2013.01); *H01L 27/1255* (2013.01); *H01L 27/1259* (2013.01); *H01L 27/1218* (2013.01)

(58) Field of Classification Search
CPC ............... H01L 27/1248; H01L 27/124; H01L 27/1255; H01L 27/1259
USPC ........................................ 257/59, 72, 432
See application file for complete search history.

(56) References Cited

U.S. PATENT DOCUMENTS 9,647,051 B2   5/2017   Kim et al.
10,134,785 B2 * 11/2018   Makita ................ H01L 27/1288
10,963,076 B2 *  3/2021   Choi ..................... H01L 27/323

FOREIGN PATENT DOCUMENTS

CN    107546247 A    1/2018
CN    108010921 A    5/2018

* cited by examiner

*Primary Examiner* — Tan N Tran

(57) ABSTRACT

A display panel and a manufacturing method thereof and a display device using the same are provided. The display panel includes a display region and a non-display region. The display panel includes a substrate, a plurality of thin film transistors (TFTs) and a planarization layer sequentially stacked and at least one buffer unit disposed between the planarization layer and the substrate, wherein the buffer unit is located outside the TFT. The buffer unit is positioned in the display region and used for buffering stress of the display panel during bending.

10 Claims, 4 Drawing Sheets

DISPLAY PANEL, MANUFACTURING METHOD FOR THE DISPLAY PANEL, AND DISPLAY DEVICE

FIELD OF INVENTION

The present invention relates to a flat display panel, and in particular to a display panel and manufacturing method thereof, and a display device having the display panel.

BACKGROUND OF INVENTION

Regarding recent technologies of the flat display panels, the organic light-emitting diode (OLED) displays have many advantages such as light and thin, active illumination, fast response, wide viewing angle, broader color gamut, high brightness, and low power consumption, therefore OLEDs gradually become a third-generation display technology after the liquid crystal display. Compared with liquid crystal displays (LCDs), OLED has the advantages of more power saving, thinner, and wide viewing angle, which is unmatched by LCDs. At present, people have higher requirements on the screen ratio of a display panel.

In order to realize the narrow bezel display of the display panel, in practice, the non-display region of the display panel is bent to the back of the display panel display screen, and then the flexible circuit board and the driver IC are bonded in the non-display region. However, when the display panel is flexibly bent, the trace in the display region is broken, and also the display panel is damaged by the stress concentration. Therefore, there is a need for a display panel and a method of manufacturing the same to solve the above problems.

SUMMARY OF INVENTION

The present invention provides a display panel, a manufacturing method thereof, and a display device, which can solve the existing problems that the trace of the display region is broken and the stress concentration and damage of the display panel is generated during the display panel is flexibly bent.

In order to solve the above problems, the technical solution is provided by the present application as follows.

According to an aspect of the preset application, a display panel having a display region and a non-display region located on a periphery of the display region is provided. The display panel includes a substrate, a thin film transistor (TFT) array disposed on the substrate and the TFT array including a plurality of TFTs arranged in an array, a planarization layer disposed on the plurality of TFTs, and at least one buffer unit disposed between the planarization layer and the substrate and located outside the TFTs. The buffer unit is positioned in the display region and used for buffering the stress of the display panel during bending.

According to an embodiment of the present invention, the TFT includes a source layer, a first gate insulating layer disposed on the source layer, a first metal layer disposed on the first gate insulating layer, a second gate insulating layer disposed on the first metal layer, a first source-drain metal layer disposed on the second gate insulating layer, an organic layer disposed on the first source-drain metal layer and a second source-drain metal layer disposed on the organic layer. The first source-drain metal layer and the second source-drain metal layer are electrically connected by a first through via, and the second source-drain metal layer is electrically connected to the source layer by a second through via.

In the display panel of the preset application, the buffer unit is located between the organic layer and the substrate and contacts the organic layer and the substrate.

In the display panel of the preset application, the buffer unit and the organic layer are made of the same material.

In the display panel of the preset application, the buffer unit is arranged between the adjacent TFTs.

In the display panel of the preset application, at least one buffer unit is arranged between the adjacent TFTs.

In the display panel of the preset application, a flexible layer is further disposed between the planarization layer and the substrate, wherein the flexible layer is located in the non-display region and contacts the planarization layer and the substrate.

In the display panel of the preset application, the display panel further includes, a third through via disposed on the planarization layer, an anode layer disposed on the planarization layer and electrically connected to the second source-drain metal layer by the third through via, a pixel definition layer disposed on the planarization layer, and at least one support pillar disposed on the pixel definition layer.

According to another aspect of the present application, a method of manufacturing the display panel is further provided, wherein the display panel includes a display region and a non-display region disposed on a periphery of the display region. The method of manufacturing the display panel includes the following steps.

In the step S10, providing a substrate and manufacturing a source layer, a first gate insulating layer, a first metal layer, a second gate insulating layer and a first source-drain metal layer in sequence on the substrate.

In the step S20, forming at least one first through hole and at least one second through hole in the first gate insulating layer and the second gate insulating layer, wherein the first through hole is positioned in the display region and the second through hole is positioned in the non-display region.

In the step S30, forming an organic layer on the first source-drain metal layer, wherein the organic material is used for filling the first through hole to form a buffer unit and used for filling the second through hole to form a flexible layer.

In the step S40, manufacturing a second source-drain metal layer, a planarization layer, an anode layer, a pixel defined definition layer and a supporting layer in sequence on the organic layer.

In the method of manufacturing the display panel of the present application, the display panel includes a plurality of TFTs arranged in an array. The TFT includes the source layer, the first gate insulating layer positioned on the source layer, the first metal layer positioned on the first gate insulating layer, the second gate insulating layer positioned on the first metal layer, the first source-drain metal layer positioned on the second gate insulating layer, the organic layer positioned on the first source-drain metal layer, and the second source-drain metal layer positioned on the organic layer. The buffer unit is arranged between the adjacent TFTs.

According to another aspect of the present application, a display device having a display panel and a touch control layer is further provided, wherein the display panel includes a display region and a non-display region disposed on a periphery of the display region. The display panel includes a substrate, a TFT array disposed on the substrate and the TFT array including a plurality of TFTs arranged in an array, a planarization layer disposed on the plurality of TFTs, and at least one buffer unit disposed between the planarization layer and the substrate and located outside the TFTs. The buffer unit is positioned in the display region and used for buffering the stress of the display panel during bending.

According to an embodiment of the present application, the TFT includes a source layer, a first gate insulating layer disposed on the source layer, a first metal layer disposed on the first gate insulating layer, a second gate insulating layer disposed on the first metal layer, a first source-drain metal layer disposed on the second gate insulating layer, an organic layer disposed on the first source-drain metal layer and a second source-drain metal layer disposed on the organic layer. The first source-drain metal layer and the second source-drain metal layer are electrically connected by a first through via, and the second source-drain metal layer is electrically connected to the source layer by a second through via.

In the display device of the present application, the buffer unit is located between the organic layer and the substrate and contacts the organic layer and the substrate.

In the display device of the present application, the buffer unit and the organic layer are made of the same material.

In the display device of the present application, the buffer unit is arranged between the adjacent TFTs.

In the display device of the present application, at least one buffer unit is arranged between the adjacent TFTs.

In the display device of the present application, a flexible layer is further disposed between the planarization layer and the substrate. The flexible layer is located in the non-display region and contacts the planarization layer and the substrate.

In the display device of the present application, the display device further includes a third through via disposed on the planarization layer, an anode layer disposed on the planarization layer and electrically connected to the second source-drain metal layer by the third through via, a pixel definition layer disposed on the planarization layer, and at least one support pillar disposed on the pixel definition layer.

The present application utilizes the arrangement of at least one buffer unit positioned in a display region of the display panel to buffer the stress when the display panel is flexibly bent. Therefore, the display panel can be prevented from stress concentration and damage.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
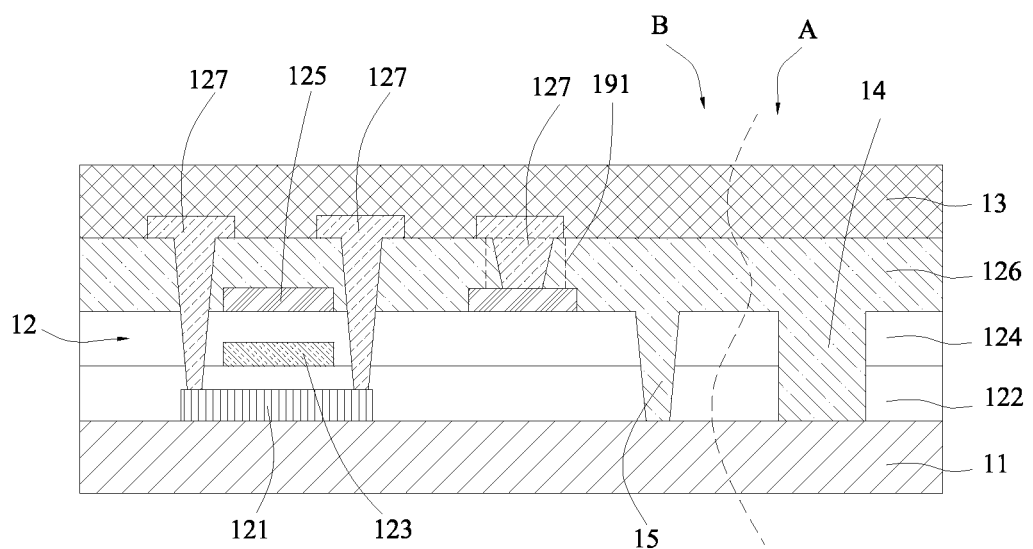
FIG. 1 is a cross-sectional view showing the structure of a liquid crystal display panel according to an embodiment of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

Referring to FIG. 1, FIG. 1 is a cross-sectional view showing the schematic structure of a liquid crystal display panel according to an embodiment of the present invention.

Figure 2:
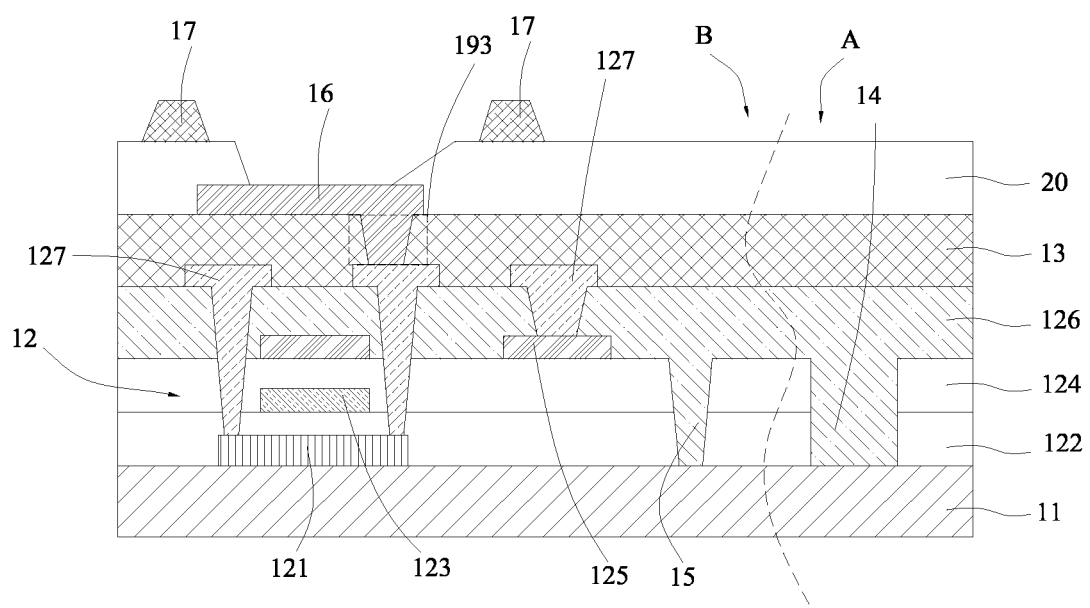
FIG. 2 is a cross-sectional view showing the structure of a liquid crystal display panel according to another embodiment of the present invention.

Referring to FIG. 2, FIG. 2 is a cross-sectional view showing the schematic structure of a liquid crystal display panel according to another embodiment of the present invention.

The present invention provides a display panel having a display region A and a non-display region B located on a periphery of the display region. The display region A includes a plurality of pixel units arranged in an array, and the non-display region B includes a pad region.

The display panel includes a substrate 11, the substrate 11 includes a flexible substrate, a shielding layer and a buffer layer. The material used to produce the flexible substrate includes polyimide. The shielding layer includes a light-blocking layer made of a metal material. The preparation material of the buffer layer includes at least one of silicon dioxide and silicon nitride.

The thin film transistor (TFT) array disposed on the substrate 11 includes a plurality of TFTs 12 arranged in an array.

According to an embodiment of the present invention, the TFT includes a source layer 121, a first gate insulating layer 122, a first metal layer 123, a second gate insulating layer 124, a first source-drain metal layer 125, an organic layer 126, and a second source-drain metal layer 127, which are sequentially stacked.

According to an embodiment of the present invention, the first metal layer 123 is a gate layer.

According to an embodiment of the present invention, compared with conventional technologies, the first source-drain metal layer 125 is used in the present application instead of the second gate layer, which enables a first metal layer 123 and the first source-drain metal layer 125 forming a storage capacitor and also the first source-drain metal layer 125 and the second source-drain metal layer 127 having an effective connection. Therefore, the voltage drop caused by the narrow bezel design of the display panel is reduced and the displaying uniformity of the display panel is more uniform. Moreover, by using the first source-drain metal layer 125 instead of the second gate layer, the second planarization layer can be omitted, the process of the display panel is effectively saved and the thickness of the film layer of the display panel is reduced accordingly.

Figure 4A:
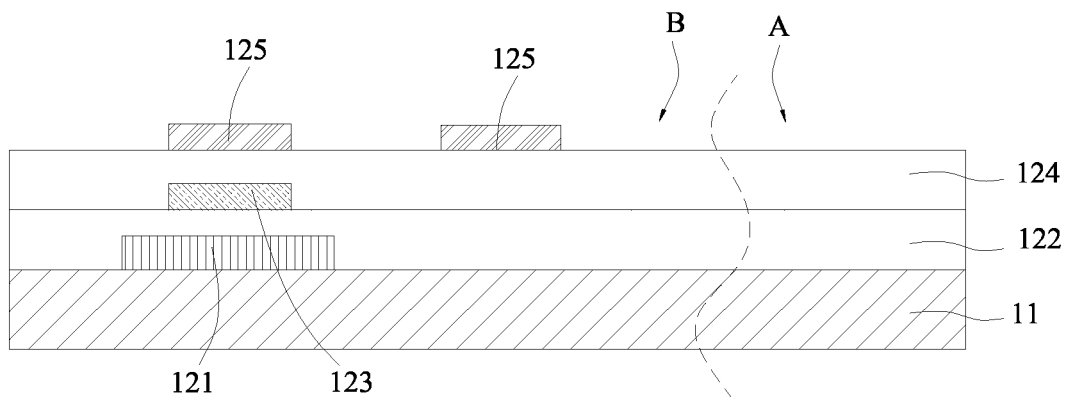
FIGS. 4a-4d are schematic diagrams showing a liquid crystal display panel fabricated by the steps according to an embodiment of the present invention.
Figure 4B:
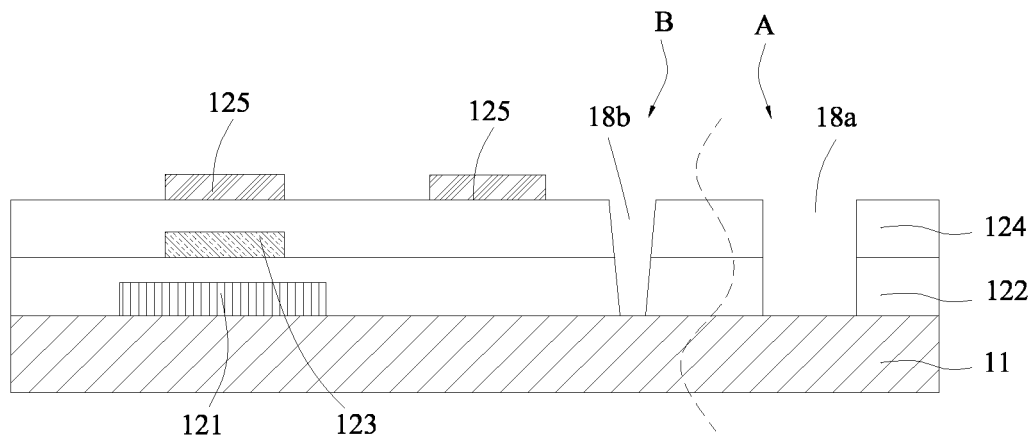
Figure 4C:
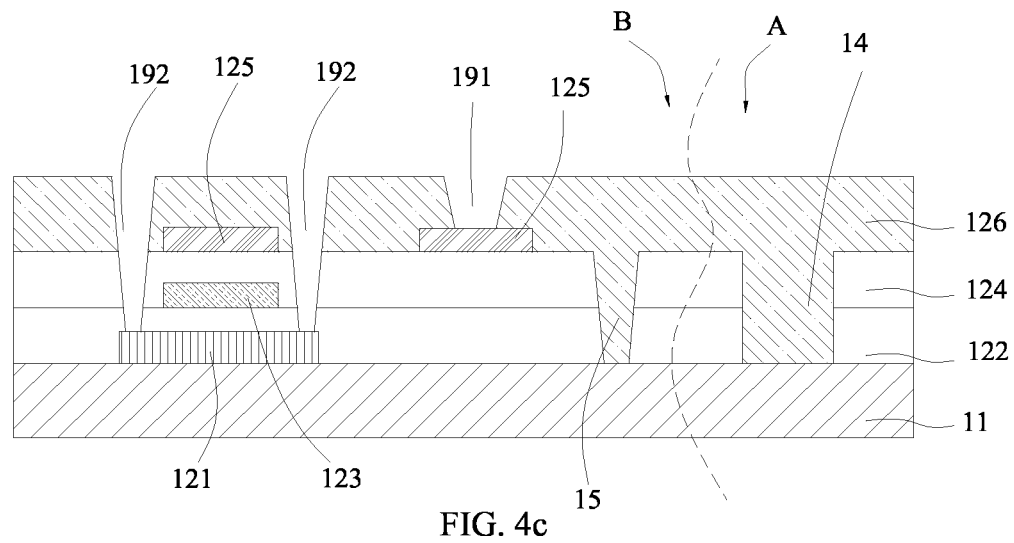
Figure 4D:
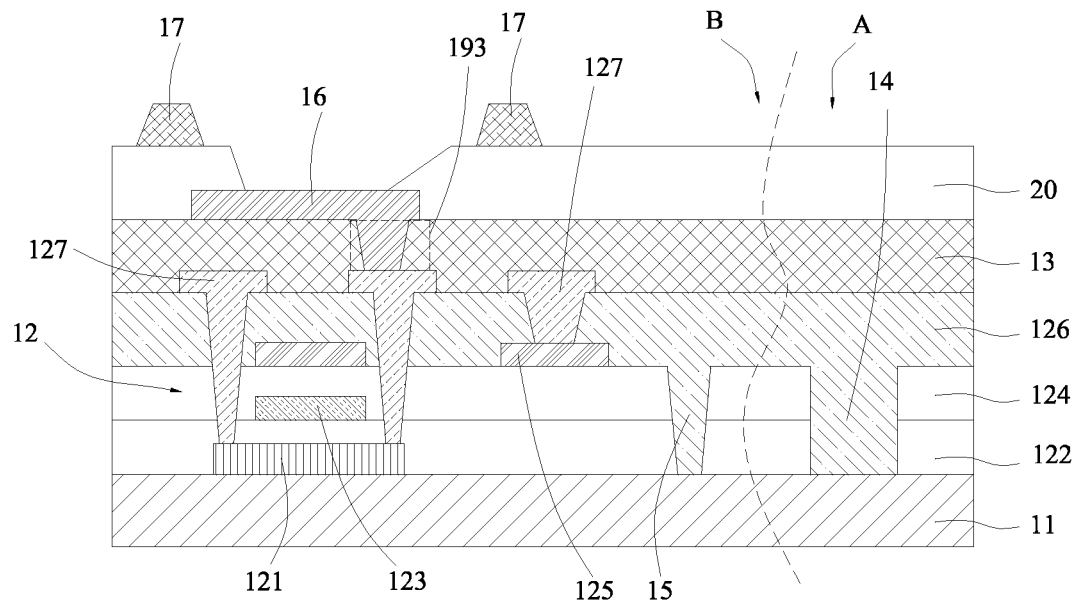

As shown in FIGS. 4c and 4d, the first source-drain metal layer 125 is electrically connected to the second source-drain metal layer 127 by the first through via 191, and the second source-drain metal layer 127 is electrically connected to the source layer 121 by the second through via 192.

Both the first source-drain metal layer 125 and the second source-drain metal layer 127 are combined of three layers of titanium, aluminum and titanium.

A planarization layer 13 is disposed on the TFT 12.

According to an embodiment of the present invention, the preparation material of the planarization layer 13 includes organic material, and at least one buffer unit 14 disposed between the planarization layer 13 and the substrate 11. The buffer unit 14 is located outside the TFTs 12. The buffer unit 14 is positioned in the display region A and used for buffering the stress of the display panel during bending.

In the present technology, most of the film layers of the display region are made of an inorganic film layer. Because of the poor ductility of the inorganic film layer, the components inside the display panel may be damaged due to the stress concentration of the inorganic film layer when the flexible bending of the display panel is performed. Furthermore, a conventional display panel provides a flexible layer only in the non-display region B, thereby realizing the static bending of the non-display region B, but such a structure cannot realize the dynamic bending of the display region A. The present invention provides a buffer unit in the display region for buffering the stress of the display panel during bending, which not only improves the bending performance of the display panel, but also facilitates dynamic bending of the non-display region A.

According to an embodiment of the present invention, the buffer unit 14 is equivalent to the "buffer band" of the display region of the display panel. Thereby the stress is released through the arrangement of the buffer unit when the display panel is bent.

The organic layer 126 is made of organic materials, and the organic material is generally good in bending property. In order to simplify the process of the display panel, the preparation material of the buffer unit 14 can be the same as that of the organic layer, so that the organic layer 126 and the buffer unit 14 are fabricated in the same process.

According to an embodiment of the present invention, the buffer unit 14 is located between the organic layer 126 and the substrate 11 and contacts the organic layer 126 and the substrate 11, thereby maximizing the proportion of the buffer unit in the display panel. Of course, the buffer unit 14 is not limited to be in contact with the organic layer 126 and the substrate 11, and may be disposed only in one of the first gate insulating layer 122 and the second gate insulating layer 124, it can be designed according to the requirement of the display panel.

According to an embodiment of the present invention, in order to avoid the influence of the buffer unit 14 on the TFT 12 in the display region, the buffer unit 14 is disposed between the adjacent TFTs 12. Therefore, the contact between the buffer unit 14 and the source layer 121, the gate 123, the first source-drain metal layer 125 and the second source-drain metal layer 127 of the TFT 12 can be avoided.

The number of buffer units 14 between the adjacent TFTs 12 is not limited to one. If the space is sufficient, two or three buffers can be arranged. Therefore, at least one buffer unit 14 is arranged between the adjacent TFTs, thereby increasing the proportion of the buffer unit in the display panel and enhancing the bending performance.

According to an embodiment of the present invention, the display panel further includes a flexible layer 15 disposed between the planarization layer 13 and the substrate 11 and contact with the planarization layer 13 and the substrate 11. The aforementioned flexible layer 15 is located in the non-display region B and is configured to realize the bending property of the non-display region B of the display panel.

The display panel further includes at least one third through via 193 disposed on the planarization layer 13, an anode layer 16 disposed on the planarization layer 13 and electrically connected to the second source-drain metal layer 127 by the third through via 193, a pixel definition layer 20 disposed on the planarization layer 13, and at least one support pillar 17 disposed on the pixel definition layer 20.

According to an embodiment of the present invention, the through via of the flexible layer located in the display region can be performed by several etchings, and the etching depth ratio is determined according to the stress condition when the display panel is bent.

The Young's modulus of the organic photoresist between the first source-drain metal layer 125 and the second source-drain metal layer 127 is less than 5 GPa. The buffer unit 14 and the flexible layer 15 are arranged to adjust the stress between the upper and lower layers so as to disperse the stress when the display panel is bent, which facilitates the bending of the first source-drain metal layer 125 and the second source-drain metal layer 127.

Figure 3:
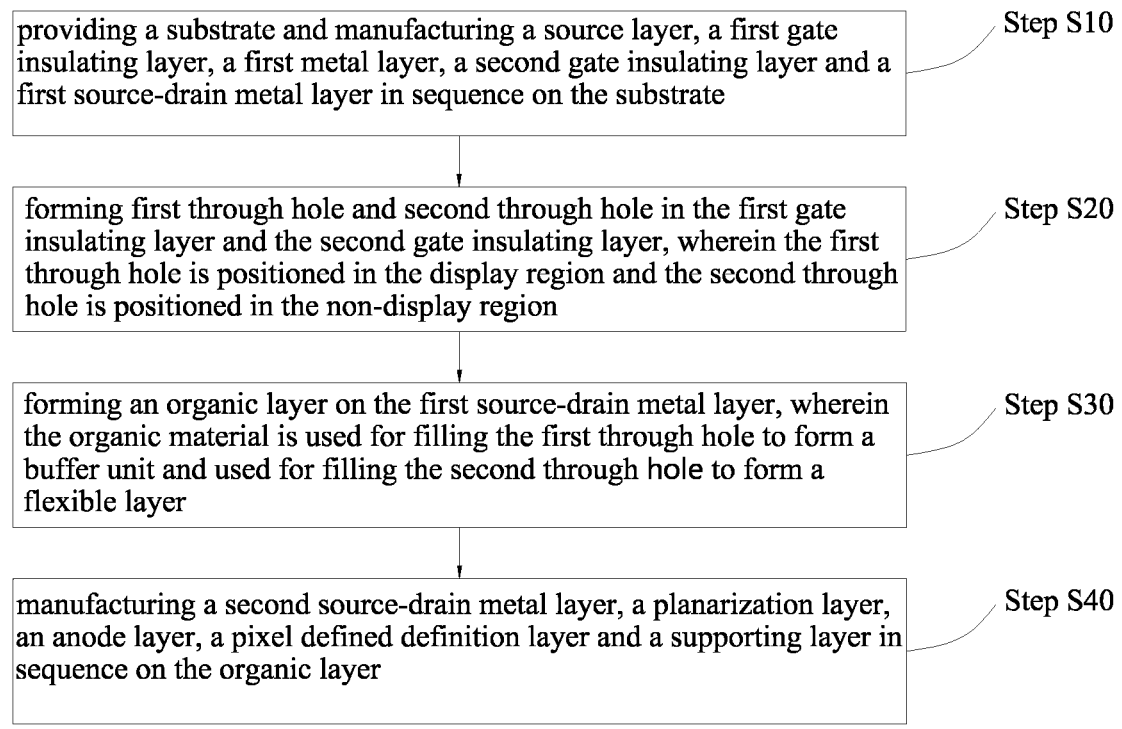
FIG. 3 is a flowchart illustrating the steps for fabricating a liquid crystal display panel according to an embodiment of the present invention.

Referring to FIG. 3 and FIGS. 4a to 4b, according to another aspect of the present invention, a method of manufacturing the display panel is further provided, wherein the display panel includes a display region and a non-display region disposed on a periphery of the display region, and the method of manufacturing the display panel includes the following steps.

As shown in FIG. 4a, in the step 10, it provides a substrate 11, the substrate 11 includes a flexible substrate, a shielding layer and a buffer layer. The preparation material of the flexible substrate includes polyimide. The shielding layer includes a light-blocking layer made of a metal material. The preparation material of the buffer layer includes at least one of silicon dioxide and silicon nitride. Furthermore, a source layer 121, a first gate insulating layer 122, a first metal layer 123, a second gate insulating layer 124, and a first source-drain metal layer 125 are sequentially formed on the substrate 11.

The aforesaid step 10 includes providing the substrate 11, forming an initial source layer on the substrate 11, and crystallizing and patterning the initial source layer to complete preparation of the source layer 121. Next, depositing the first gate insulating layer 122 and an initial first metal layer on the source layer 121, and patterning the initial first metal layer to form the first metal layer 123. Then, forming the second insulating layer 124 and an initial first source-drain metal layer on the first metal layer 123, and patterning the initial first source-drain metal layer to form the first source-drain metal layer 125.

As shown in FIG. 4b, the step 20 includes forming at least one first through hole 18a and at least one second through hole 18b in the first gate insulating layer 122 and the second gate insulating layer 124. The first through hole 18a is positioned on the display region A and the second through hole 18b is positioned on the non-display region B.

As shown in FIG. 4c, the step 30 includes forming an organic layer 126 on the first source-drain metal layer 125, wherein the organic material is used for filling the first through hole 18a to form a buffer unit 14 and used for filling the second through hole 18b to form a flexible layer 14. The organic layer 126, the buffer unit 14 and the flexible layer 15 are all fabricated with one mask, thereby saving the usage times of the mask in the display panel.

According to an embodiment of the present invention, at least one first through via 191 electrically connected both the second source-drain metal layer 127 and the first source-drain metal layer 125 and at least one second through via 192 aligned with the second source-drain metal layer 127 and the source layer 121 are formed in the organic layer 126.

Further, etching the target locations of the first gate insulating layer 122 and the second gate insulating layer 124 to form a via connecting the second source-drain metal layer 127 and the source layer 121.

As shown in FIG. 4d, in the step 40, the second source-drain metal layer 127, a planarization layer 13, an anode layer 16, a pixel definition layer 20, and a supporting layer 17 are sequentially formed on the organic layer 126.

According to an embodiment of the present invention, the display panel includes a plurality of TFTs arranged in an array. The TFT includes the source layer 121, the first gate insulating layer 122 positioned on the source layer, the first metal layer 123 positioned on the first gate insulating layer 122, the second gate insulating layer 124 positioned on the first metal layer 123, the first source-drain metal layer 125 positioned on the second gate insulating layer 124, the organic layer 126 positioned on the first source-drain metal layer 125, and the second source-drain metal layer 127 positioned on the organic layer 126. The buffer unit 14 is arranged between the adjacent TFTs.

The present invention provides a display panel and a manufacturing method thereof, by arranging at least one buffer unit in a display region of the display panel to buffer the stress when the display panel is flexibly bent. Therefore, the display panel can be prevented from stress concentration and damage.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel having a display region and a non-display region located on a periphery of the display region, the display panel comprising:
   a substrate;
   a thin film transistor (TFT) array disposed on the substrate, the TFT array including a plurality of thin film transistors (TFTs) arranged in an array;
   a planarization layer disposed on the plurality of TFTs; and
   at least one buffer unit disposed between the planarization layer and the substrate and located outside the TFTs;
   wherein the buffer unit is positioned in the display region and used for buffering the stress of the display panel during bending; wherein the TFT includes: a source layer; a first gate insulating layer disposed on the source layer; a first metal layer disposed on the first gate insulating layer; a second gate insulating layer disposed on the first metal layer; a first source-drain metal layer disposed on the second gate insulating layer; an organic layer disposed on the first source-drain metal layer and a second source-drain metal layer disposed on the organic layer; wherein the first source-drain metal layer and the second source-drain metal layer are electrically connected by a first through via, and the second source-drain metal layer is electrically connected to the source layer by a second through via; wherein the buffer unit is located between the organic layer and the substrate and contacts the organic layer and the substrate; and wherein the buffer unit and the organic layer are made of a same material.

2. The display panel according to claim 1, wherein the buffer unit is arranged between the adjacent TFTs.

3. The display panel according to claim 1, wherein at least one buffer unit is arranged between the adjacent TFTs.

4. The display panel according to claim 1, further comprising a flexible layer disposed between the planarization layer and the substrate, wherein the flexible layer is located in the non-display region and contacts the planarization layer and the substrate.

5. The display panel according to claim 2, further comprising:
   a third through via disposed on the planarization layer;
   an anode layer disposed on the planarization layer, wherein the anode layer is electrically connected to the second source-drain metal layer by the third through via;
   a pixel definition layer disposed on the planarization layer; and
   at least one support pillar disposed on the pixel definition layer.

6. A display device having a display panel and a touch layer, wherein the display panel is arranged with a display region and a non-display region located on a periphery of the display region and further comprises:
   a substrate;
   a TFT array disposed on the substrate, the TFT array including a plurality of TFTs arranged in an array;
   a planarization layer disposed on the plurality of TFTs; and
   at least one buffer unit disposed between the planarization layer and the substrate and located outside the TFT;
   wherein the buffer unit is positioned in the display region and used for buffering the stress of the display panel during bending; wherein the TFT includes: a source layer; a first gate insulating layer disposed on the source layer; a first metal layer disposed on the first gate insulating layer; a second gate insulating layer disposed on the first metal layer; a first source-drain metal layer disposed on the second gate insulating layer; an organic layer disposed on the first source-drain metal layer and a second source-drain metal layer disposed on the organic layer; wherein the first source-drain metal layer and the second source-drain metal layer are electrically connected by a first through via, and the second source-drain metal layer is electrically connected to the source layer by a second through via; wherein the buffer unit is located between the organic layer and the substrate and contacts the organic layer and the substrate; and wherein the buffer unit and the organic layer are made of a same material.

7. The display device according to claim 6, wherein the buffer unit is arranged between the adjacent TFTs.

8. The display device according to claim 6, wherein at least one buffer unit is arranged between the adjacent TFTs.

9. The display device according to claim 6, further comprising a flexible layer disposed between the planarization layer and the substrate, wherein the flexible layer is located in the non-display region and contacts the planarization layer and the substrate.

10. The display device according to claim 6, further comprising:
    a third through via disposed on the planarization layer;
    an anode layer disposed on the planarization layer, wherein the anode layer is electrically connected to the second source-drain metal layer by the third through via;
    a pixel definition layer disposed on the planarization layer; and at least one support pillar disposed on the pixel definition layer.

\* \* \* \* \*